United States Patent
Agrawal et al.

(10) Patent No.: US 7,427,874 B1
(45) Date of Patent: Sep. 23, 2008

(54) INTERFACE BLOCK ARCHITECTURES

(75) Inventors: Om P. Agrawal, Los Altos, CA (US);
Ravindar M. Lall, Portland, OR (US);
David L. Rutledge, Portland, OR (US);
Tom Gustafson, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/949,454

(22) Filed: Dec. 3, 2007

Related U.S. Application Data

(63) Continuation of application No. 11/287,720, filed on Nov. 28, 2005, now Pat. No. 7,327,159.

(51) Int. Cl.
*H03K 19/173* (2006.01)

(52) U.S. Cl. .......................... 326/38; 326/41

(58) Field of Classification Search .............. 326/37–41
See application file for complete search history.

(56) References Cited

U.S. PATENT DOCUMENTS 5,801,547 A * 9/1998 Kean ............................ 326/40
6,144,220 A * 11/2000 Young ........................ 326/41

* cited by examiner

*Primary Examiner*—Don P Le

(57) ABSTRACT

A programmable logic device in accordance with an embodiment of the invention includes configurable logic blocks, embedded random access memory (RAM) blocks, and input/output blocks adapted to transfer information into or out of the programmable logic device. An interconnect architecture is adapted to route information among the configurable logic blocks, embedded RAM blocks, and input/output blocks within the programmable logic device. An interface block is provided that couples an embedded RAM block and an input/output block but not a logic block to the interconnect architecture.

20 Claims, 5 Drawing Sheets

INTERFACE BLOCK ARCHITECTURES

RELATED APPLICATION DATA

This application is a continuation of U.S. application Ser. No. 11/287,720, filed Nov. 28, 2005, now U.S. Pat. No. 7,327,159, which is hereby incorporated by reference in its entirety.

TECHNICAL FIELD

The present invention relates generally to electrical circuits and, more particularly, to interface block architectures, such as for programmable logic devices.

BACKGROUND

Programmable logic devices are utilized in a wide variety of applications. A typical programmable logic device (PLD, such as a field programmable gate array (FPGA) or a complex programmable logic device (CPLD)) may include a is number of logic blocks, memory blocks (e.g., embedded blocks of random access memory (RAM)), and input/output (I/O) blocks interconnected generally through a programmable routing architecture (also referred to as the interconnect architecture).

The logic blocks (also referred to in the art as programmable logic cells, logic array blocks, or configurable logic blocks) and memory blocks are conventionally coupled through the interconnect architecture to the I/O blocks through a corresponding common routing interface block (also referred to as a common interface block or CIB) and the CIB also couples the I/O blocks to the interconnect architecture. For example, FIG. 1 shows a conventional PLD 100 having logic blocks 120 organized in a row and column fashion (e.g., a three-by-three arrangement of rows R1-R3 and columns C1-C3). Each row includes a corresponding horizontal routing resource 130 and each column includes a corresponding vertical routing resource 140 as part of the interconnect architecture.

PLD 100 also includes I/O blocks 150 (which communicate through pins 160 to external devices (not shown)) and common interface blocks (CIBs) 170 through which horizontal and vertical routing resources 130 and 140 are coupled to I/O blocks 150. As an interface, CIB 170 can be implemented in any number of ways, such as a distinct switch matrix or other I/O element (IOE) or as an integral part of I/O block 150.

One CIB 170 may be located at the end of each row and column and serve as the interface between I/O blocks 150 and logic blocks 120 and the interconnect architecture. For example, CIB 170a located at the end of the row R1 may couple to and serve as the interface to the corresponding horizontal routing resource 130a for row R1, to the corresponding vertical routing resource 140a for column C1, and to adjacent CIBs 170.

One drawback of the generic CIB approach for the blocks (e.g., logic, memory, and I/O blocks) is that the CIB must be designed to interface with logic blocks, memory blocks, and I/O blocks (e.g., designed for the lowest common denominator). This may be an advantage in terms of symmetry or ease of use, but typically results in silicon and resource inefficiencies. For example, the CIBs may represent significant overhead and a significant percentage of the silicon area relative to the corresponding blocks.

Another drawback of the conventional PLD architecture is that optional embedded memory blocks are typically arranged in dedicated rows of memory blocks, which cannot be mixed with the logic blocks and generally divides up the logic blocks into discrete sections. For example, logic blocks 120 of the row R2 may be replaced with a row of the memory blocks. As illustrated in FIG. 2, for example, one or more memory blocks 202 may be situated between rows of logic blocks 204 (e.g., logic blocks 120 with at least a portion of the interconnect routing structure included), with memory blocks 202 having corresponding CIBs 170. I/O blocks 150 (e.g., PIC or programmable I/O cells) are also provided with corresponding CIBs 170. As illustrated further in FIG. 3, one or more separate and independent generic CIBs 170 are provided for memory blocks 202, I/O blocks 150, and/or logic blocks 204.

Thus, the memory blocks typically are coupled within the logic block array, which restricts the designer's mixing and matching of the number of memory blocks and logic blocks for particular design requirements or targeted applications (e.g., memory blocks to logic blocks ratio) and also limits the placement of the memory blocks and logic blocks within the PLD (e.g., relative to the interconnect architecture to avoid unacceptable routing congestion). As a result, there is a need for improved PLD architectures, such as for the interface block architectures.

SUMMARY

In accordance with one embodiment of the present invention, a programmable logic device comprises configurable logic blocks including a logic section configurable to perform a logic function; embedded random access memory (RAM) blocks adapted to store information in the programmable logic device; and input/output blocks adapted to transfer information into or out of the programmable logic device. An interconnect architecture is adapted to route information among the configurable logic blocks, embedded RAM blocks, and input/output blocks within the programmable logic device. An interface block is adapted to couple an embedded RAM block and an input/output block but not a logic block to the interconnect architecture.

In accordance with another embodiment of the present invention, a programmable logic device comprises configurable logic blocks including a logic section configurable to perform a logic function; embedded random access memory (RAM) blocks adapted to store information in the programmable logic device; and input/output blocks adapted to transfer information into or out of the programmable logic device. An interconnect architecture is adapted to route information among the configurable logic blocks, embedded RAM blocks, and input/output blocks within the programmable logic device. Each interface block of a first set of interface blocks is adapted to couple an embedded RAM block and an input/output block but not a logic block to the interconnect architecture. Each interface block of a second set of interface blocks is adapted to couple at least an input/output block and a logic block to the interconnect architecture.

In accordance with another embodiment of the present invention, a programmable logic device comprises an array of configurable logic blocks, each logic block of the array including a logic section configurable to perform a logic function; embedded random access memory (RAM) blocks disposed outside the array and adapted to store information in the programmable logic device; and input/output blocks adapted to transfer information into or out of the programmable logic device. An interconnect architecture is adapted to route information among the configurable logic blocks, embedded RAM blocks, and input/output blocks within the programmable logic device. Each interface block of a first set of interface blocks is adapted to couple an embedded RAM block and an input/output block but not a logic block to the interconnect architecture. At least two of the interface blocks of the first set are adapted to couple at least two input/output blocks exclusively and one embedded RAM block in common to the interconnect architecture. Each interface block of a second set of interface blocks is adapted to couple at least an input/output block and a logic block to the interconnect architecture.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 4:
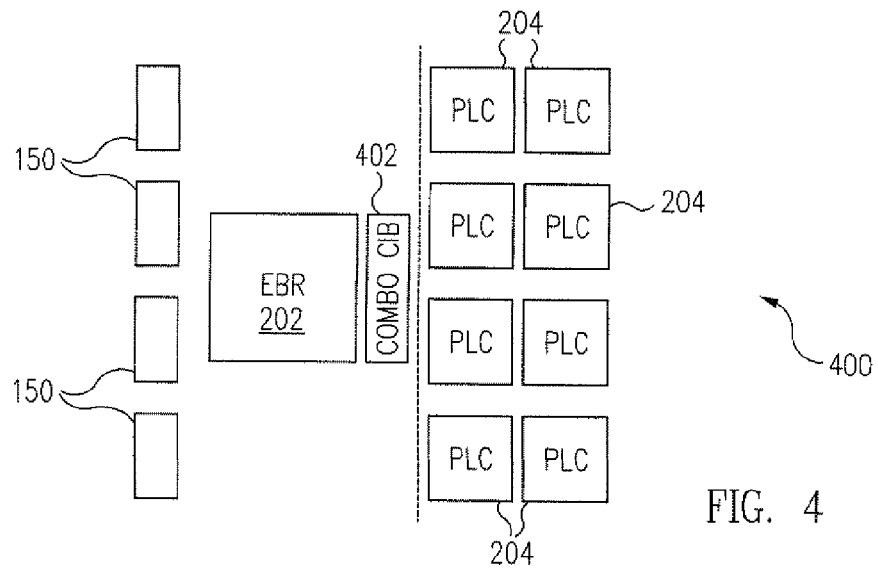
FIG. 4 shows a block diagram illustrating a programmable logic device with embedded memory in accordance with an embodiment of the present invention.

FIG. 4 shows a block diagram illustrating a programmable logic device (PLD) 400 in accordance with an embodiment of the present invention. PLD 400 is a simplified PLD block diagram and it should be understood that the number of I/O, logic, and memory shown is exemplary and is not limiting. Furthermore, it should be understood that various conventional features or functions are not shown for clarity.

Figure 1:
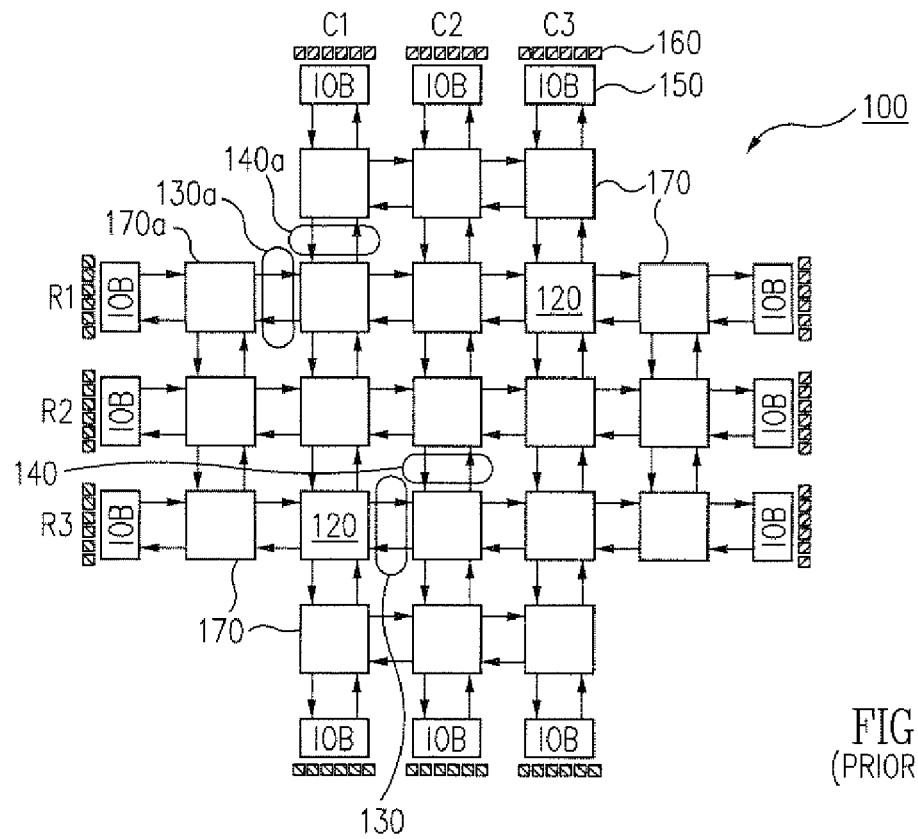
FIG. 1 shows a block diagram illustrating a conventional programmable logic device.
Figure 2:
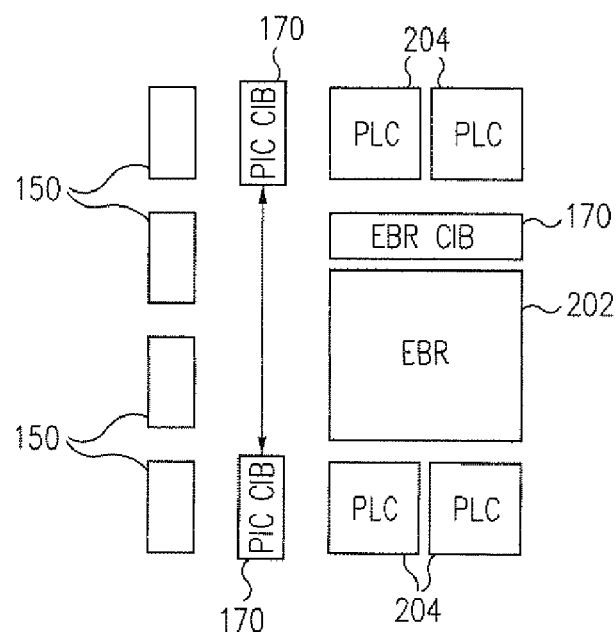
FIG. 2 shows a block diagram illustrating a conventional programmable logic device with embedded memory.
Figure 3:
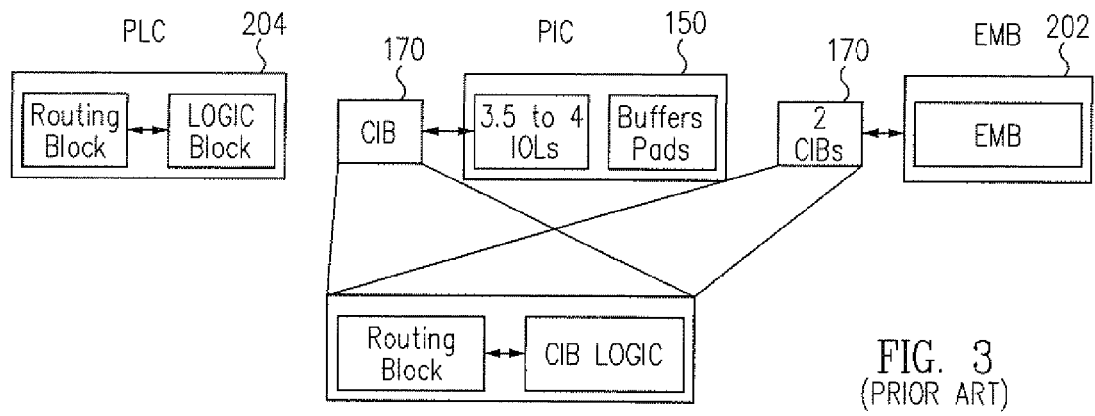
FIG. 3 shows a block diagram illustrating a conventional common interface block architecture for a programmable logic device.

PLD 400 includes I/O blocks 150, logic blocks 204, memory block 202, and an interface block 402. Logic blocks 204 represent conventional logic blocks arranged, for example, in rows and columns (e.g., as described similarly in reference to FIG. 1, where the terms rows and columns are used as reference and may be used interchangeably depending upon one's perspective without limitation). I/O blocks 150 and memory block 202 may also represent conventional I/O blocks and memory blocks, respectively.

Interface block 402 represents a common interface block (CIB) to support one or more I/O blocks 150 and one or more memory blocks 202. Thus, interface block 402 (labeled combo CIB) may be viewed as representing a CIB that supports the interface combination of one or more I/O blocks 150 and one or more memory blocks 202. For example, interface block 402 may provide CIB functionality for four I/O blocks 150 and one memory block 202, as illustrated in FIG. 4.

Interface block 402, by providing interface functionality to the combination of one or more I/O blocks 150 and memory blocks 202, may provide certain advantages over conventional techniques. For example, interface block 402 may provide a more optimal connectivity for each memory block 202 and I/O block 150 supported by interface block 402. Furthermore, interface block 402 may reduce the overall number of CIBs (e.g., by 33%), relative to conventional CIB techniques, and may provide die size or circuit area savings. By supporting one or more I/O blocks 150 and memory blocks 202, interface block 402 may also provide an optimized CIB without compromising routability.

Interface block 402 also allows the decoupling of memory block 202 from logic blocks 204. For example as shown in FIG. 4, memory block 202 may be positioned outside of the array of logic blocks 204, rather than as a dedicated row of memory blocks 202 that divides the array of logic blocks 204, as discussed herein in reference to conventional techniques. Thus, one or more memory blocks 202 may be conceptually decoupled from logic blocks 204 and positioned outside of the array of logic blocks 204 to provide a more flexible structure to mix and match the number of memory blocks 202 and logic blocks 204 within a PLD. For example, the number of memory blocks 202 may be easily adjusted as each is disposed outside of the array of logic blocks 204 (e.g., aligned in a vertical arrangement rather than the conventional horizontal arrangement in rows). Furthermore, memory blocks 202 may be implemented to optimize the routing interface area with respect to memory blocks 202 and I/O blocks 150 and/or logic blocks 204 for a particular PLD design or application.

Figure 5:
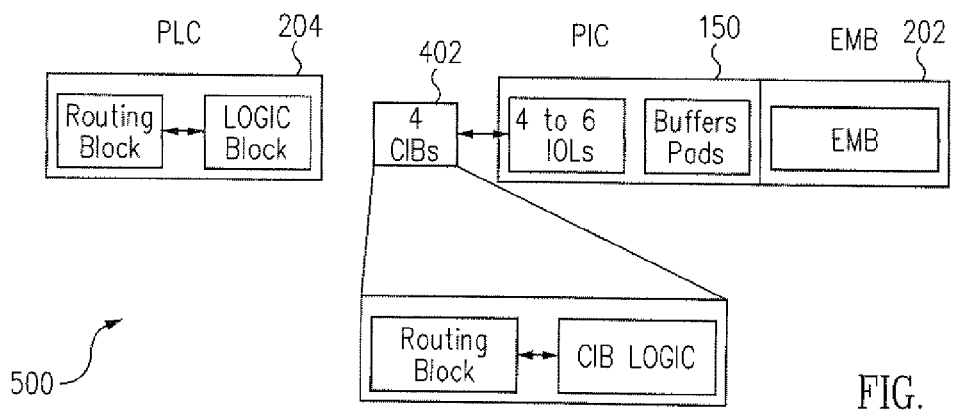
FIG. 5 shows a block diagram illustrating a common interface block architecture for a programmable logic device in accordance with an embodiment of the present invention.

FIG. 5 shows an exemplary block diagram illustrating certain aspects of a PLD architecture 500 that implements interface block 402 in accordance with an embodiment of the present invention. Logic block 204, as with conventional logic blocks, may include a logic section, which provides the logic functionality, and a routing section, which includes the necessary routing segments and associated memory cells, switches, and multiplexers.

Interface block 402 provides the combined CIB for one or more I/O blocks 150 and memory blocks 202. Interface block 402 may include a routing section, similar to that for logic block 204, and a CIB logic section, which provides any necessary, buffering, inverting, testing logic, or other conventional CIB functionality necessary for the desired application. It should be noted that at least a portion of the CIB logic may be provided by or extracted from a neighboring logic block 204 of PLD 500.

As an example, in accordance with an embodiment of the present invention, interface block 402 may be implemented in a modular fashion so that one or more interface blocks 402 may be utilized to provide the combined CIB interface for one or more I/O blocks 150 and one or more memory blocks 202. For example, as illustrated in FIG. 5, four interface blocks 402 are utilized and function together to provide the combined CIB interface for four to six programmable I/O circuits (labeled as IOLs along with corresponding buffer pads) within I/O block 150 and one memory block 202 (labeled embedded memory block (EMB)). Thus, one or more interface blocks 402 may be optimized to provide CIB functionality to one or more I/O blocks 150 and one or more memory blocks 202.

Interface block 402 may also be implemented to provide certain vertical and/or horizontal connectivity, depending upon its location and number/type of I/O blocks 150 and memory blocks 202 being supported. For example, in accordance with an embodiment of the present invention, interface block 402 may provide vertical and horizontal connectivity for memory blocks 202 and I/O blocks 150. Alternatively for example, in accordance with an embodiment of the present invention, interface block 402 may only provide horizontal or vertical connectivity for I/O blocks 150, depending upon their location on the PLD.

As an example, interface blocks 402 may only provide horizontal connectivity for I/O blocks 150 located to the left and/or right of the array of logic blocks 204, and similarly interface blocks 402 may only provide vertical connectivity for I/O blocks 150 located above and/or below the array of logic blocks 204. Thus, interface blocks 402 may be optimized for the desired number of I/O blocks 150 and memory blocks 202 and for the desired horizontal and/or vertical connectivity to the interconnect architecture. Furthermore, the number of I/O ports may be optimized based upon the number of I/O blocks 150 and memory blocks 202 supported.

Figure 6:
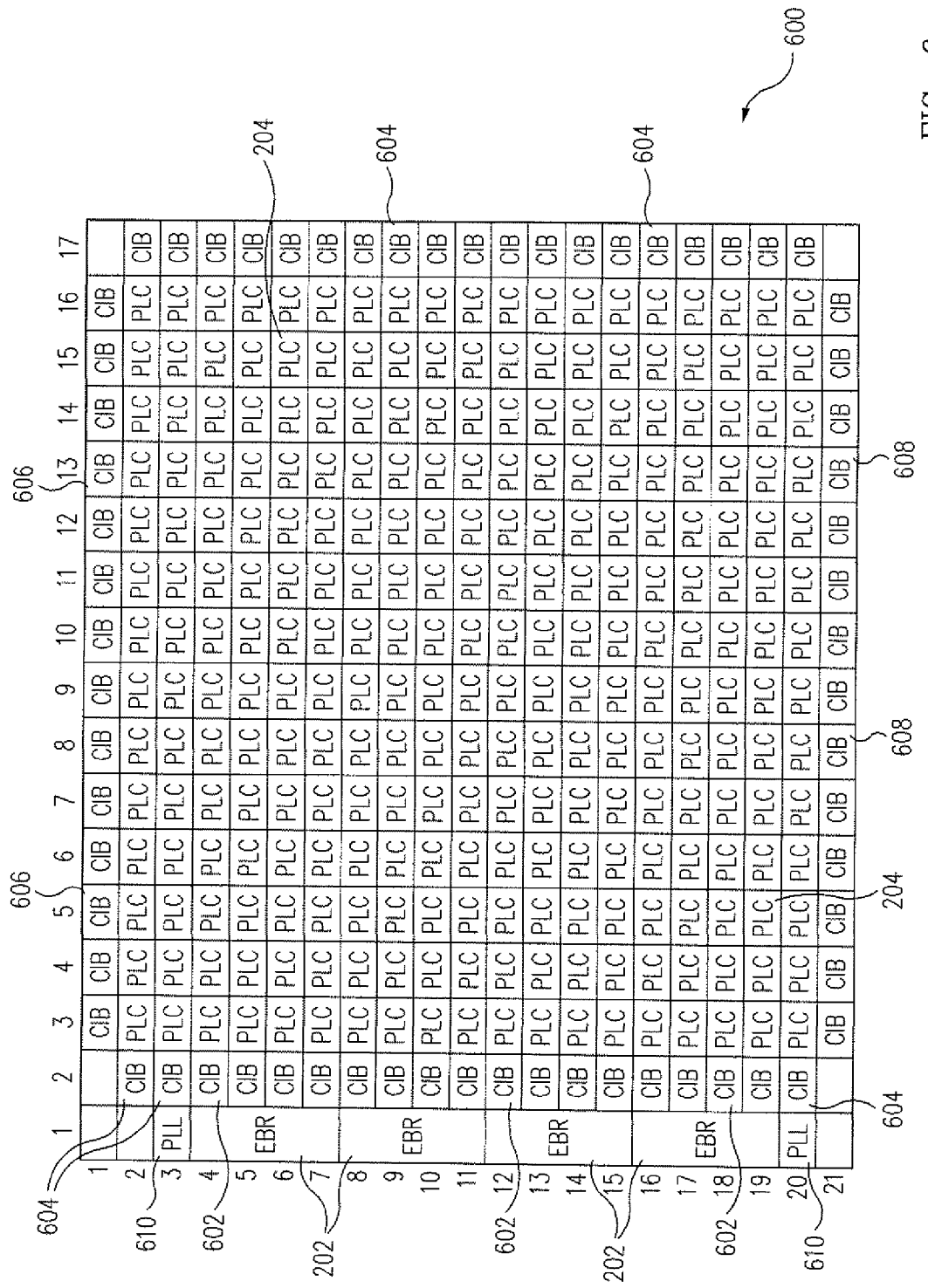
FIG. 6 shows a block diagram illustrating a programmable logic device in accordance with an embodiment of the present invention.

FIG. 6 shows a block diagram illustrating a PLD 600 in accordance with an embodiment of the present invention. PLD 600 includes logic blocks 204, memory blocks 202, and interface blocks 602, 604, 606, and 608. Logic blocks 204 (e.g., labeled and representing programmable logic cells (PLCs) or other types of logic blocks) are arranged in an exemplary 19 by 14 array to provide the programmable logic for PLD 600. There are shown four exemplary memory blocks 202 arranged along a side of the array (e.g., in column 1) to provide embedded memory within PLD 600 (e.g., labeled and representing embedded block RAM (EBR) or other types of memory). PLD 600 also includes two exemplary phase-lock loop (PLL) blocks 610 within column 1 along with memory blocks 202.

Interface blocks 602, 604, 606, and 608 provide the routing interface (e.g., CIB functionality) for PLD 600. Interface blocks 602 may represent the combination CIBs for memory blocks 202 and associated I/O blocks 150 (not shown), as discussed similarly for interface blocks 402. For example, there may be four interface blocks 602 that provide the combined CIB functionality for the associated memory block 202 and associated I/O blocks 150 (e.g., twenty four I/O blocks 150). As further described herein in accordance with an embodiment of the present invention, interface blocks 602 may provide horizontal and vertical connectivity for the associated memory blocks 202, while providing only horizontal connectivity for the associated I/O blocks 150.

Interface blocks 604, 606, and/or 608 may also represent combination CIBs as described similarly herein for interface blocks 402 and provide horizontal and/or vertical connectivity for associated blocks. Consequently, some functionality of interface blocks 604, 606, and 608 may not be utilized. Alternatively, interface blocks 604, 606, and 608 may represent conventional CIBs 170 to provide the required interface functionality for logic blocks 204. For example, interface blocks 606 and 608 may provide the horizontal and/or vertical routing interface for the associated logic blocks 204 (e.g., within respective columns). As another example, interface blocks 604 may provide the horizontal and/or vertical routing interface for the associated logic blocks 204 (e.g., within respective rows).

In accordance with one or more embodiments of the present invention, the CIB architecture disclosed herein may be implemented in a number of different ways as would be appreciated by one skilled in the art. For example, interface block 402 may be implemented as a switch matrix or other type of IOE, switch, or routing element.

Figure 7:
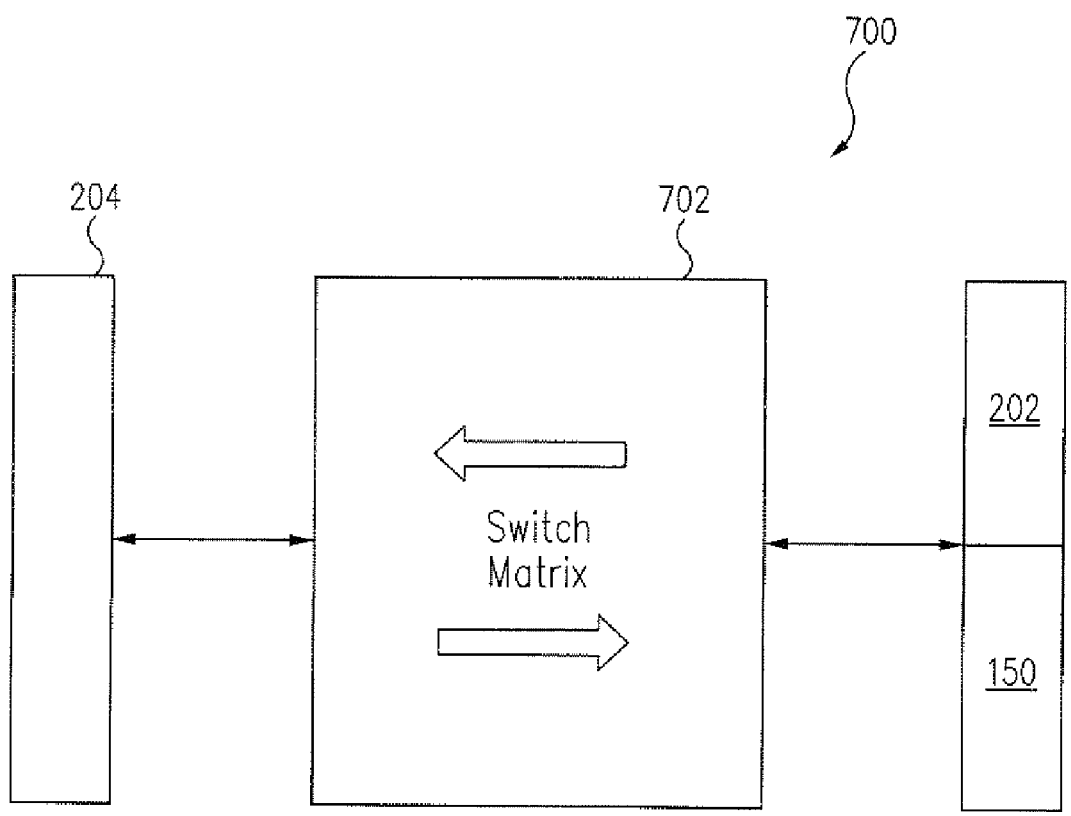
FIG. 7 shows a block diagram illustrating a programmable logic device in accordance with an embodiment of the present invention.

As a specific implementation example for interface block 402, FIG. 7 shows a block diagram illustrating a PLD 700 in accordance with an embodiment of the present invention. PLD 700 includes logic block 204, one or more I/O blocks 150, one or more memory blocks 202, and a switch matrix 702. Switch matrix 702 represents an exemplary implementation for interface block 402, which provides routing interface functionality for I/O block 150 and memory block 202. As would be understood by one skilled in the art, switch matrix 702 may be implemented, for example, with multiplexers to provide input switch functionality and output switch functionality, as discussed herein for interface block 402.

Figure 8:
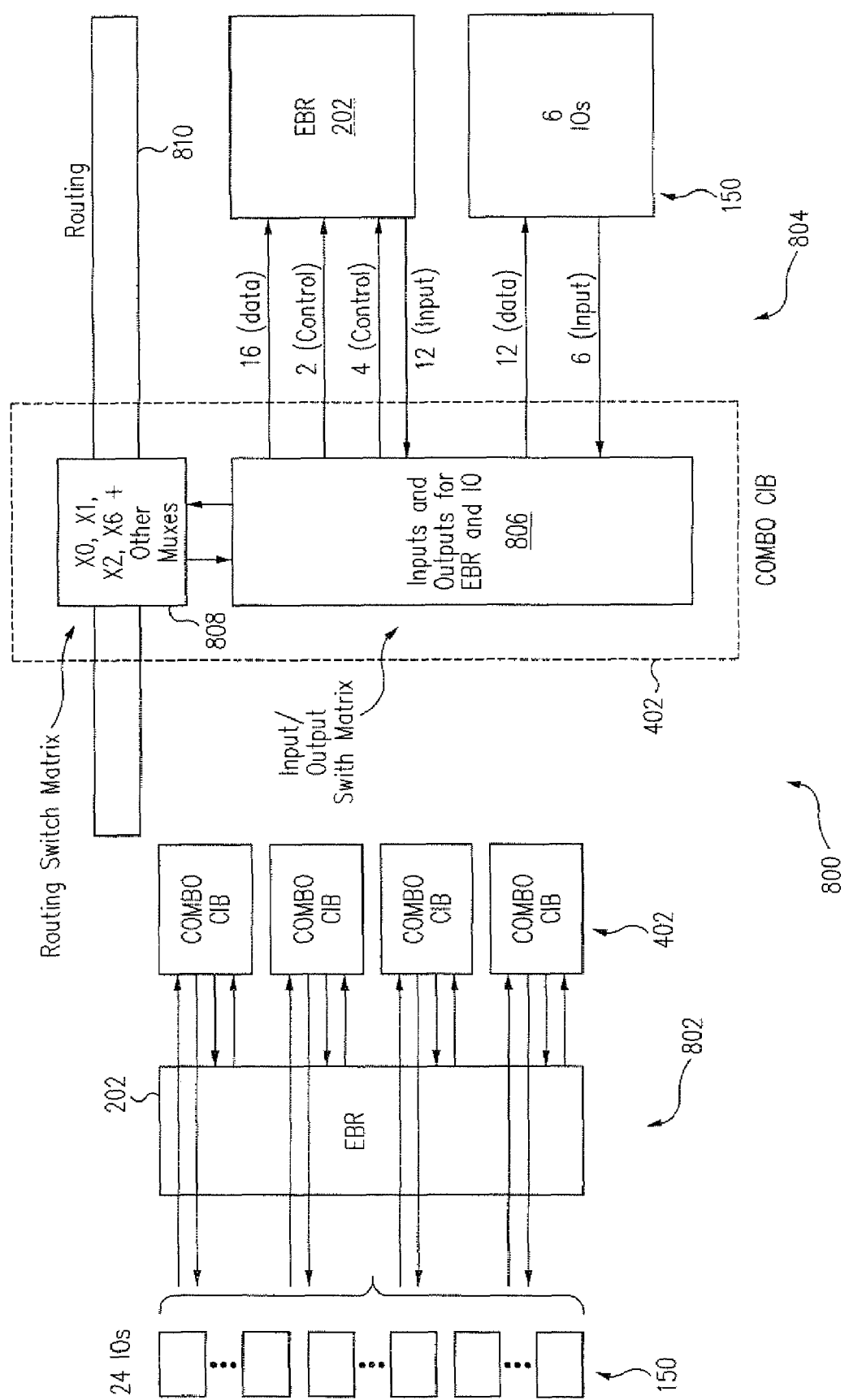
FIG. 8 shows a block diagram illustrating a common interface block architecture for a programmable logic device in accordance with an embodiment of the present invention.

More specifically, FIG. 8 shows a block diagram illustrating a specific exemplary implementation for a common interface block architecture 800 for a PLD in accordance with an embodiment of the present invention. Specifically, a block diagram 802 illustrates four interface blocks 402 (shown and labeled as four combo CIBs) providing interface functionality for one memory block 202 and twenty four I/O blocks 150 (24 IOs). It should be noted that each interface block 402 provides some interface routing functionality for memory block 202 and at least one of the twenty four I/O blocks 150. For this specific example, each interface block 402 provides 34 output signals to memory block 202 and six I/O blocks 150 (e.g., 22 and 12 output signals to memory block 202 and six I/O blocks 150, respectively) and receives 18 input signals from memory block 202 and six I/O blocks 150 (e.g., 12 and 6 input signals from memory block 202 and six I/O blocks 1507 respectively).

A block diagram 804 illustrates certain exemplary implementation specifics for common interface block architecture 800 in accordance with an embodiment of the present invention. For example, each interface block 402 includes an input/output (I/O) switch matrix 806 and a routing switch matrix 808 to support signal routing for six I/O blocks 150 and also support a portion of the signal routing for memory block 202.

Routing switch matrix 808 routes signals between routing resource 810 (e.g., an interconnect architecture, such as horizontal routing resource 130 and/or vertical routing resource 140) within the PLD and I/O switch matrix 806. For example, routing switch matrix 808 may include a number of multiplexers (e.g., labeled X0, X1, X2, and X6 plus additional multiplexers) to route the signals and provide routing connectivity.

Specifically for example, routing switch matrix 808 may employ an 18:1 multiplexer (representing X0), a 20:1 multiplexer (representing X1), a 20:1 multiplexer (representing X2), and a 16:1 multiplexer (representing X6) to route signals from routing resource 810 to I/O switch matrix 806. In a similar fashion, routing switch matrix 808 would employ additional multiplexers to route signals from I/O switch matrix 806 to routing resource 810 (e.g., to horizontal routing resource 130 and/or vertical routing resource 140). For example, routing switch matrix 808 may only route signals from I/O blocks 150 via I/O switch matrix 806 to horizontal routing resource 130 or vertical routing resource 140, as disclosed herein, while routing signals from memory block 202 via I/O switch matrix 806 to horizontal routing resource 130 and vertical routing resource 140.

I/O switch matrix 806 receives the signals from routing switch matrix 808 and routes the signals appropriately to memory block 202 and six I/O blocks 150, as illustrated in an exemplary fashion in FIG. 8. For example, I/O switch matrix 806 may include a number of multiplexers to route the signals, such as a 25:1 multiplexer, a 16:1 multiplexer, a 25:1 multiplexer, and a 20:1 multiplexer, for data output signals, control signals, clock control signals, and general control signals (e.g., CE and LSR), respectively, for memory block 202, and a 25:1 multiplexer for data output signals for six I/O blocks 150. In a similar fashion, I/O switch matrix 806 also routes signals from memory block 202 and six I/O blocks 150 to routing switch matrix 808.

Systems and methods are disclosed herein to provide, for example, one or more interface architectures for a PLD. For example, in accordance with an embodiment of the present invention, an interface block is disclosed to support the interface requirements for I/O blocks and memory blocks (e.g., combination common interface block (CIB) architecture). The interface block implementation may reduce the number of independent CIBs for the I/O blocks or the memory blocks. The interface block may also provide an optimized CIB architecture for vertical and horizontal connectivity without compromising routability, which may result in reducing and optimizing the required CIB area.

The interface block architecture, for example, may be beneficial for low cost PLDs and/or for I/O intensive PLD applications. For example, in accordance with an embodiment of the present invention, an exemplary implementation of a CIB architecture disclosed herein may be found in Lattice® Semiconductor Corporation's MachXO Family of PLDs.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device comprising:
   configurable logic blocks including a logic section configurable to perform a logic function;
   embedded random access memory (RAM) blocks adapted to store information in the programmable logic device;
   input/output blocks adapted to transfer information into or out of the programmable logic device;
   an interconnect architecture adapted to route information among the configurable logic blocks, embedded RAM blocks, and input/output blocks within the programmable logic device; and
   an interface block adapted to couple an embedded RAM block and an input/output block but not a logic block to the interconnect architecture.

2. The programmable logic device of claim 1, wherein the interconnect architecture comprises vertical and horizontal routing resources, the interface block adapted to couple the embedded RAM block to the vertical routing resource and the horizontal routing resource and adapted to couple the input/output block to only the vertical routing resource or the horizontal routing resource.

3. The programmable logic device of claim 1, wherein the interface block is adapted to couple at least two input/output blocks and an embedded RAM block to the interconnect architecture.

4. The programmable logic device of claim 1, wherein the interface block is adapted to couple four input/output blocks and one embedded RAM block to the interconnect architecture.

5. The programmable logic device of claim 1 including at least two interface blocks, wherein each interface block is adapted to couple at least two input/output blocks exclusively and one embedded RAM block in common to the interconnect architecture.

6. The programmable logic device of claim 1, wherein the interface block comprises a routing switch matrix and an input/output switch matrix.

7. The programmable logic device of claim 1, wherein the configurable logic blocks are included in a logic block array, and the embedded RAM block is disposed outside the logic block array.

8. The programmable logic device of claim 1, wherein the embedded RAM block comprises a block having multiple columns and rows of memory cells.

9. The programmable logic device of claim 1, wherein the programmable logic device comprises a field programmable gate array (FPGA).

10. A programmable logic device comprising:
    configurable logic blocks including a logic section configurable to perform a logic function;
    embedded random access memory (RAM) blocks adapted to store information in the programmable logic device;
    input/output blocks adapted to transfer information into or out of the programmable logic device;
    an interconnect architecture adapted to route information among the configurable logic blocks, embedded RAM blocks, and input/output blocks within the programmable logic device;
    a first set of interface blocks, each interface block of the first set adapted to couple an embedded RAM block and an input/output block but not a logic block to the interconnect architecture; and
    a second set of interface blocks, each interface block of the second set is adapted to couple at least an input/output block and a logic block to the interconnect architecture.

11. The programmable logic device of claim 10, wherein at least two interface blocks of the first set are adapted to couple at least two input/output blocks and one embedded RAM block to the interconnect architecture.

12. The programmable logic device of claim 11, wherein the configurable logic blocks are included in a logic block array, and the embedded RAM block is disposed outside the logic block array.

13. The programmable logic device of claim 10, wherein at least two interface blocks of the first set are adapted to couple at least two input/output blocks exclusively and one embedded RAM block in common to the interconnect architecture.

14. The programmable logic device of claim 13, wherein the configurable logic blocks are included in a logic block array, and the embedded RAM block is disposed outside the logic block array.

15. The programmable logic device of claim 10, wherein the embedded RAM blocks each comprise a block having multiple columns and rows of memory cells.

16. The programmable logic device of claim 10, wherein the interconnect architecture comprises vertical and horizontal routing resources, the interface blocks of the first set adapted to couple the embedded RAM blocks to the vertical routing resource and the horizontal routing resource and adapted to couple the input/output blocks to only the vertical routing resource or the horizontal routing resource.

17. A programmable logic device comprising:
    an array of configurable logic blocks, each logic block of the array including a logic section configurable to perform a logic function;
    embedded random access memory (RAM) blocks disposed outside the array and adapted to store information in the programmable logic device;

input/output blocks adapted to transfer information into or out of the programmable logic device;

an interconnect architecture adapted to route information among the configurable logic blocks, embedded RAM blocks, and input/output blocks within the programmable logic device;

a first set of interface blocks, each interface block of the first set adapted to couple an embedded RAM block and an input/output block but not a logic block to the interconnect architecture, at least two of the interface blocks of the first set adapted to couple at least two input/output blocks exclusively and one embedded RAM block in common to the interconnect architecture; and a second set of interface blocks, each interface block of the second set adapted to couple at least an input/output block and a logic block to the interconnect architecture.

18. The programmable logic device of claim 17, wherein the interconnect architecture comprises vertical and horizontal routing resources, the interface blocks of the first set adapted to couple the embedded RAM blocks to the vertical routing resource and the horizontal routing resource and adapted to couple the input/output blocks to only the vertical routing resource or the horizontal routing resource.

19. The programmable logic device of claim 17, wherein each interface block of the first set comprises a routing switch matrix and an input/output switch matrix.

20. The programmable logic device of claim 17, wherein the embedded RAM blocks each comprise a block having multiple columns and rows of memory cells.

* * * * *